United States Patent [19]
Panigrahi et al.

[11] 4,321,694
[45] Mar. 23, 1982

[54] CHARGE COUPLED DEVICE MEMORY WITH ENHANCED ACCESS FEATURES

[75] Inventors: Godavarish Panigrahi, East Windsor, N.J.; Satish L. Rege, Marlboro, Mass.

[73] Assignee: Burroughs Corporation, Detroit, Mich.

[21] Appl. No.: 74,831

[22] Filed: Sep. 12, 1979

Related U.S. Application Data

[63] Continuation of Ser. No. 905,425, May 12, 1978, abandoned.

[51] Int. Cl.³ .............................................. G11C 21/00
[52] U.S. Cl. ........................................ 365/77; 365/183
[58] Field of Search ...................... 365/73, 77, 78, 183

[56] References Cited

U.S. PATENT DOCUMENTS

| | | | |
|---|---|---|---|
| 3,760,382 | 9/1973 | Itoh | 365/73 |
| 3,893,088 | 7/1975 | Bell | 365/78 |
| 4,084,154 | 4/1978 | Panigrahi | 365/73 |

FOREIGN PATENT DOCUMENTS 519761 7/1976 U.S.S.R. ................... 365/77

OTHER PUBLICATIONS

Altman, "The New Concept for Memory and Imaging; Charge Coupling", Electronics, 6/21/71, pp. 50-59.
Boyle et al, "Charged-Coupled Devices-a New Approach to MIS Device Structures", IEEE Spectrum, 7/71, pp. 18-27.

Primary Examiner—Stuart N. Hecker
Attorney, Agent, or Firm—Mervyn L. Young; Charles J. Fassbender; Kevin R. Peterson

[57] ABSTRACT

A circulating shift register memory, particularly adaptable to charge coupled device technology, wherein a plurality of circulating shift registers are arranged to provide a matrix of data bits accessible at a common data front. Address counter circuitry cooperating with the register clocking circuits selects a particular bit location on the data front for each shift of the shift registers. Depending upon a mode signal and beginning address from a host system, the address counter circuitry provides successive accesses in predetermined patterns, for example along a row, column or diagonal of the bit matrix.

3 Claims, 19 Drawing Figures

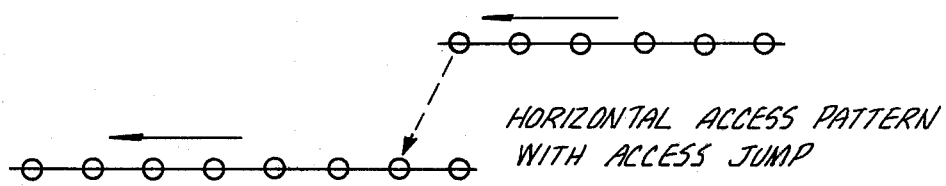
FIG. 7. Horizontal access pattern with access jump
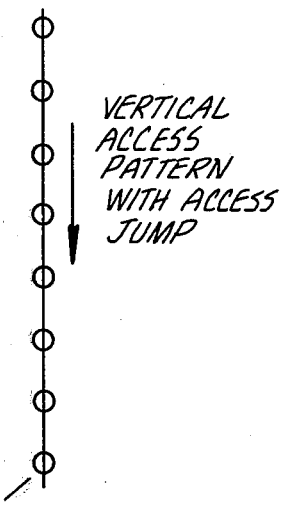
FIG. 8. Vertical access pattern with access jump
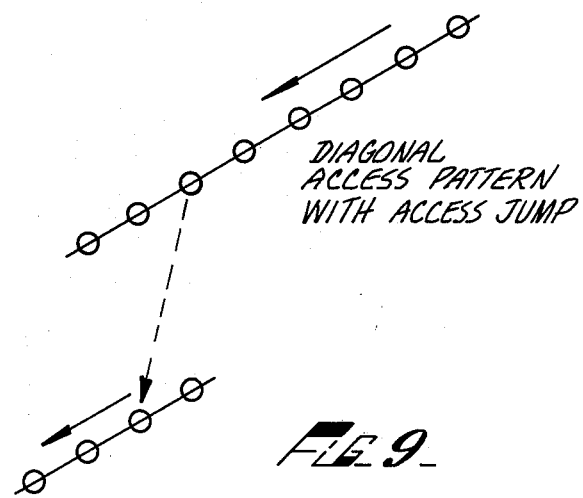
FIG. 9. Diagonal access pattern with access jump

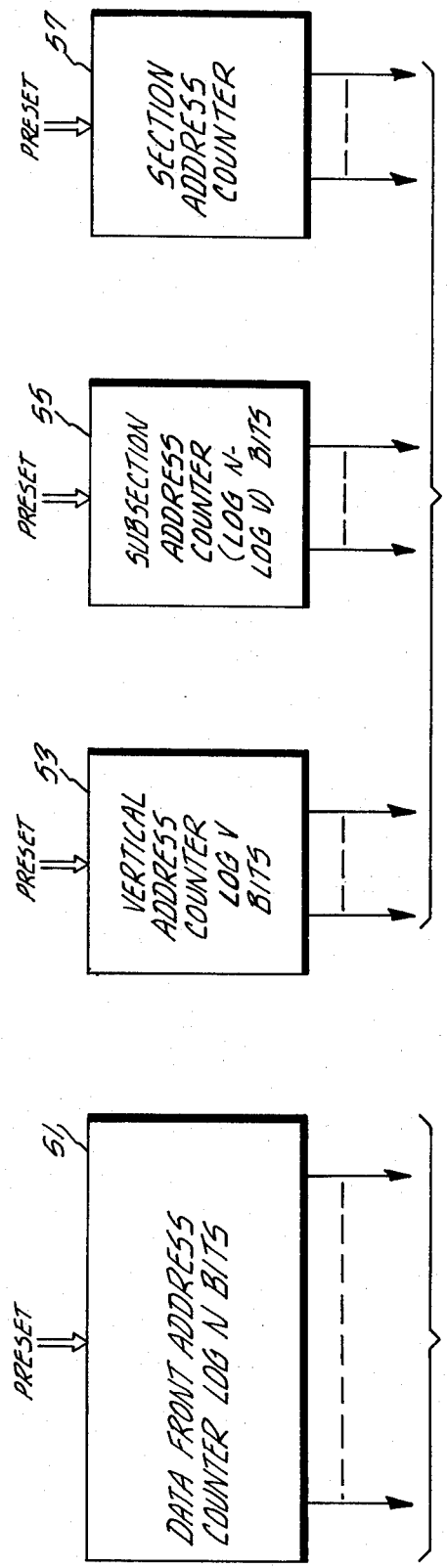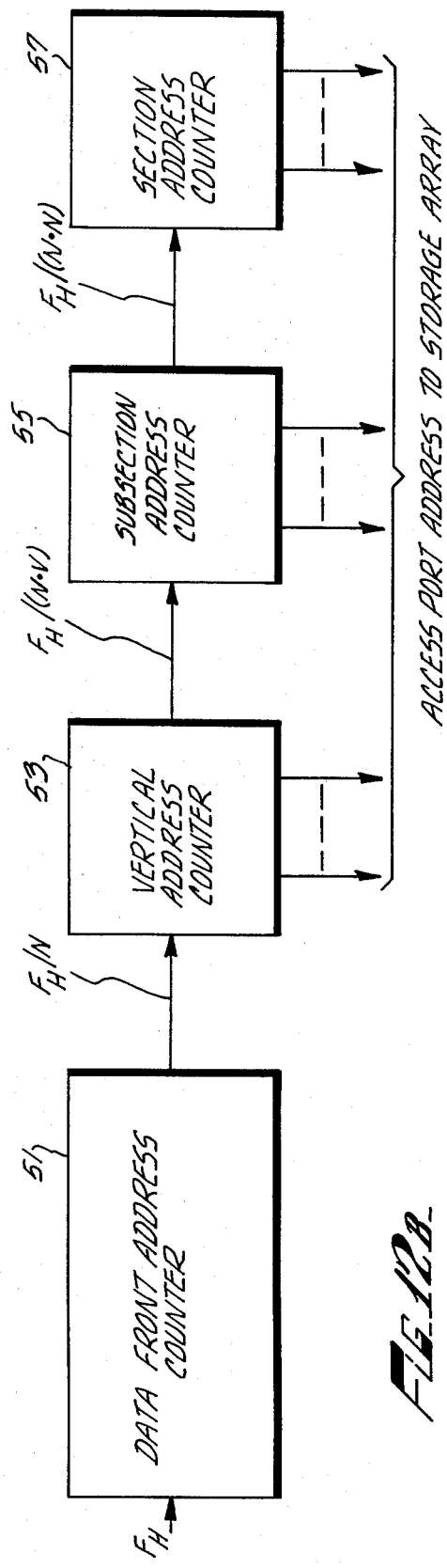

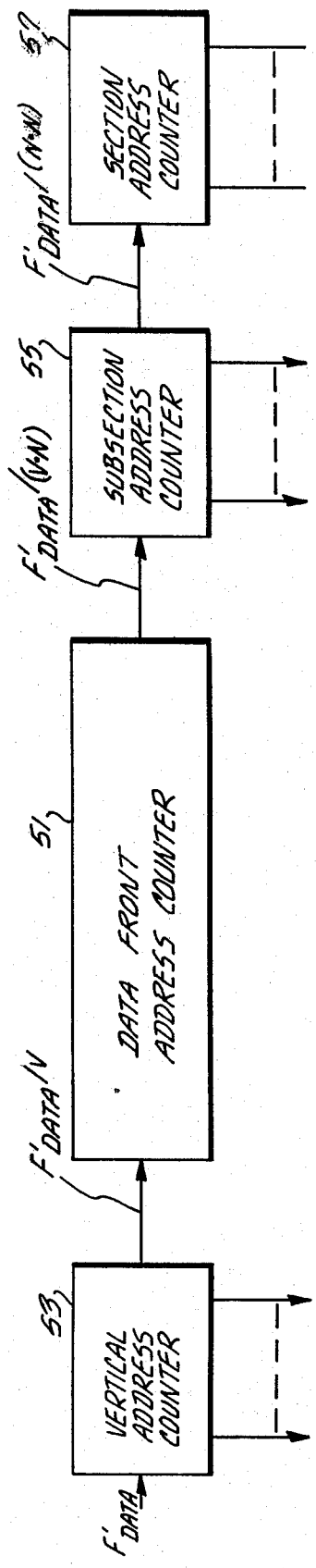
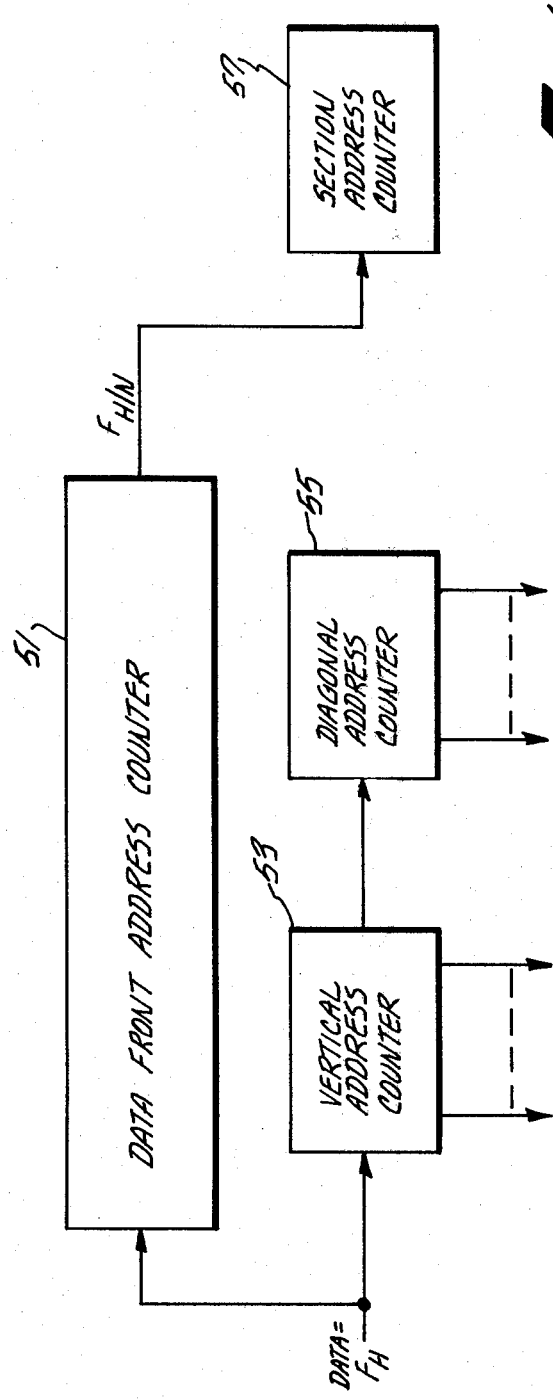

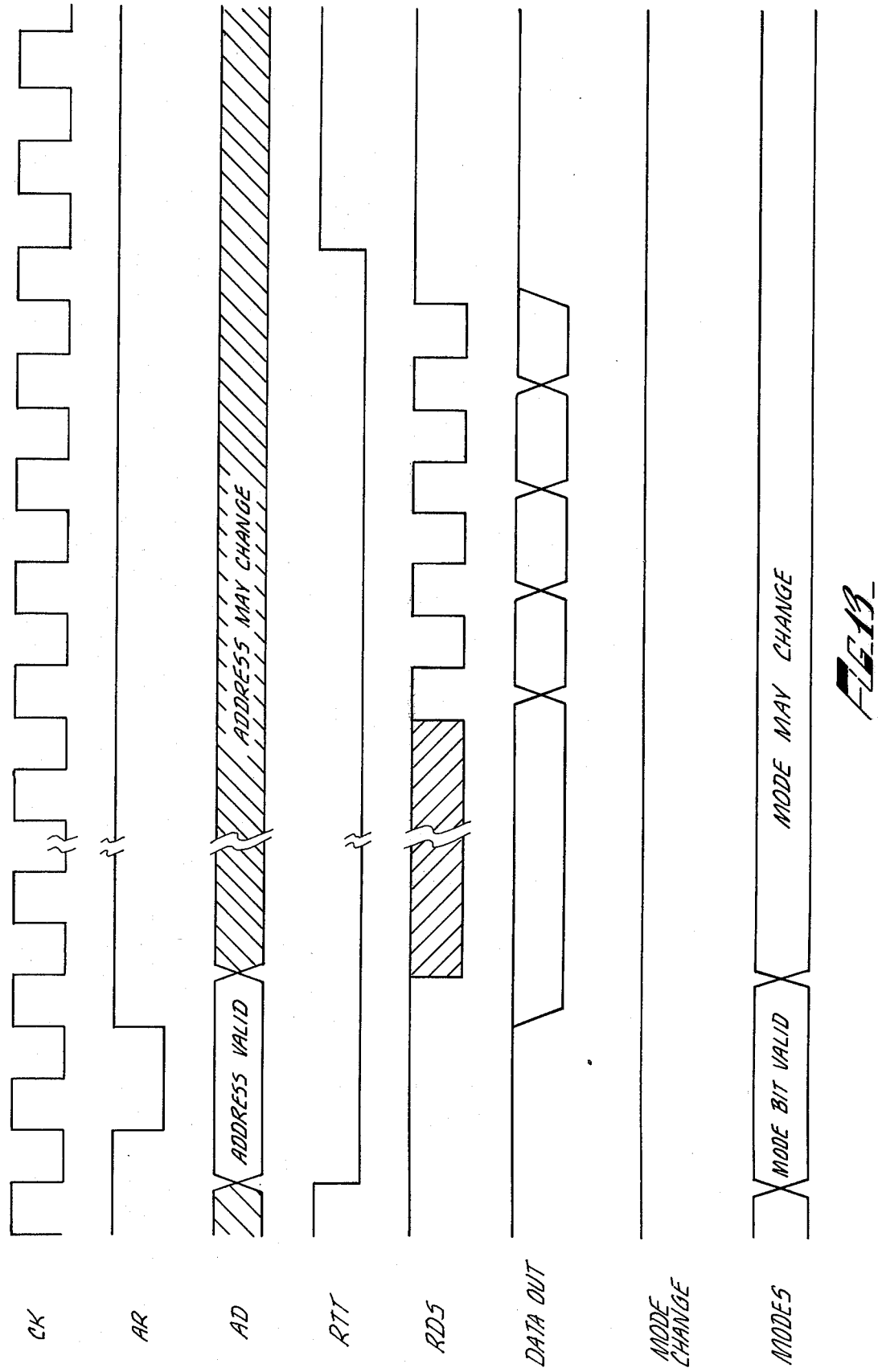

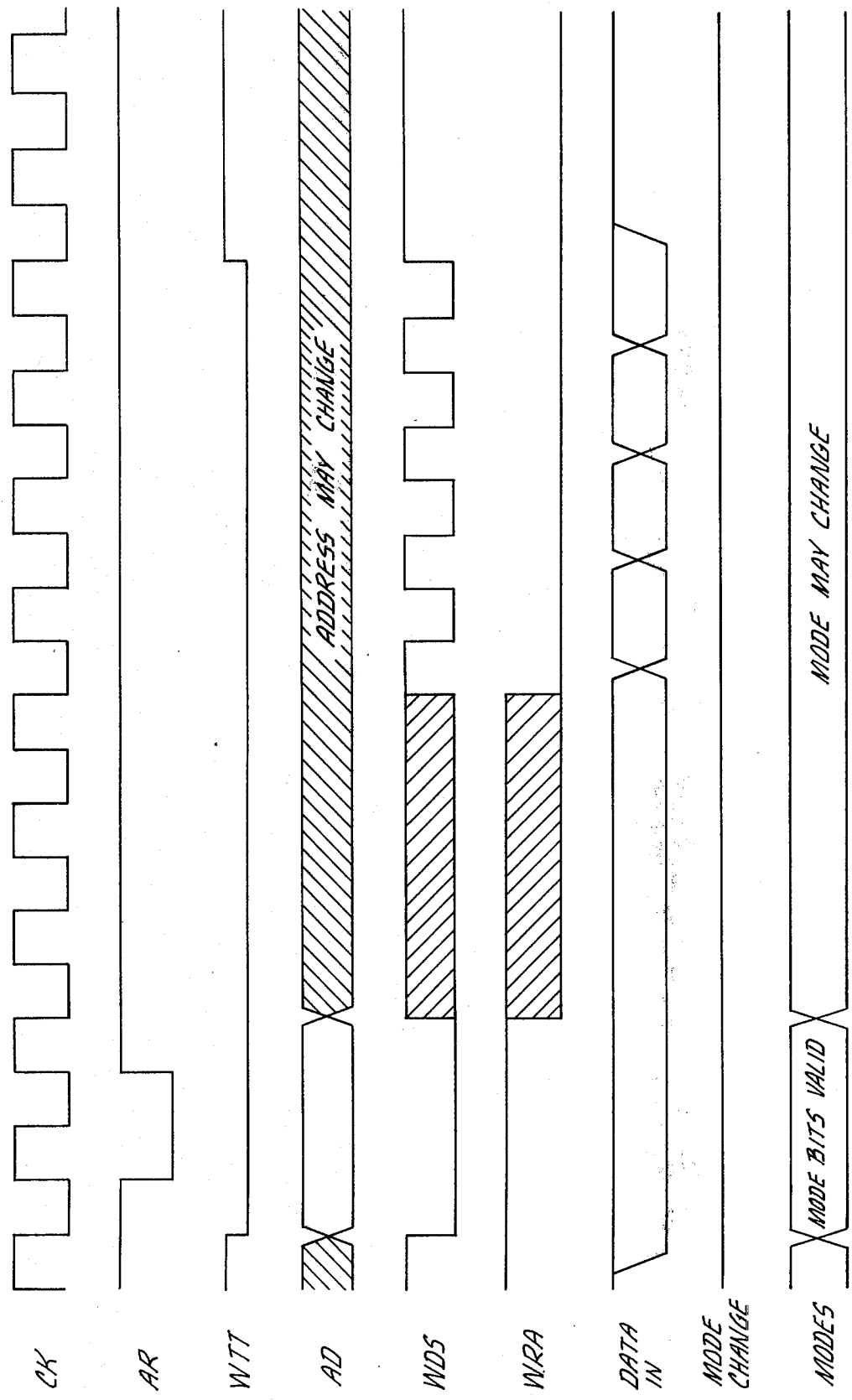

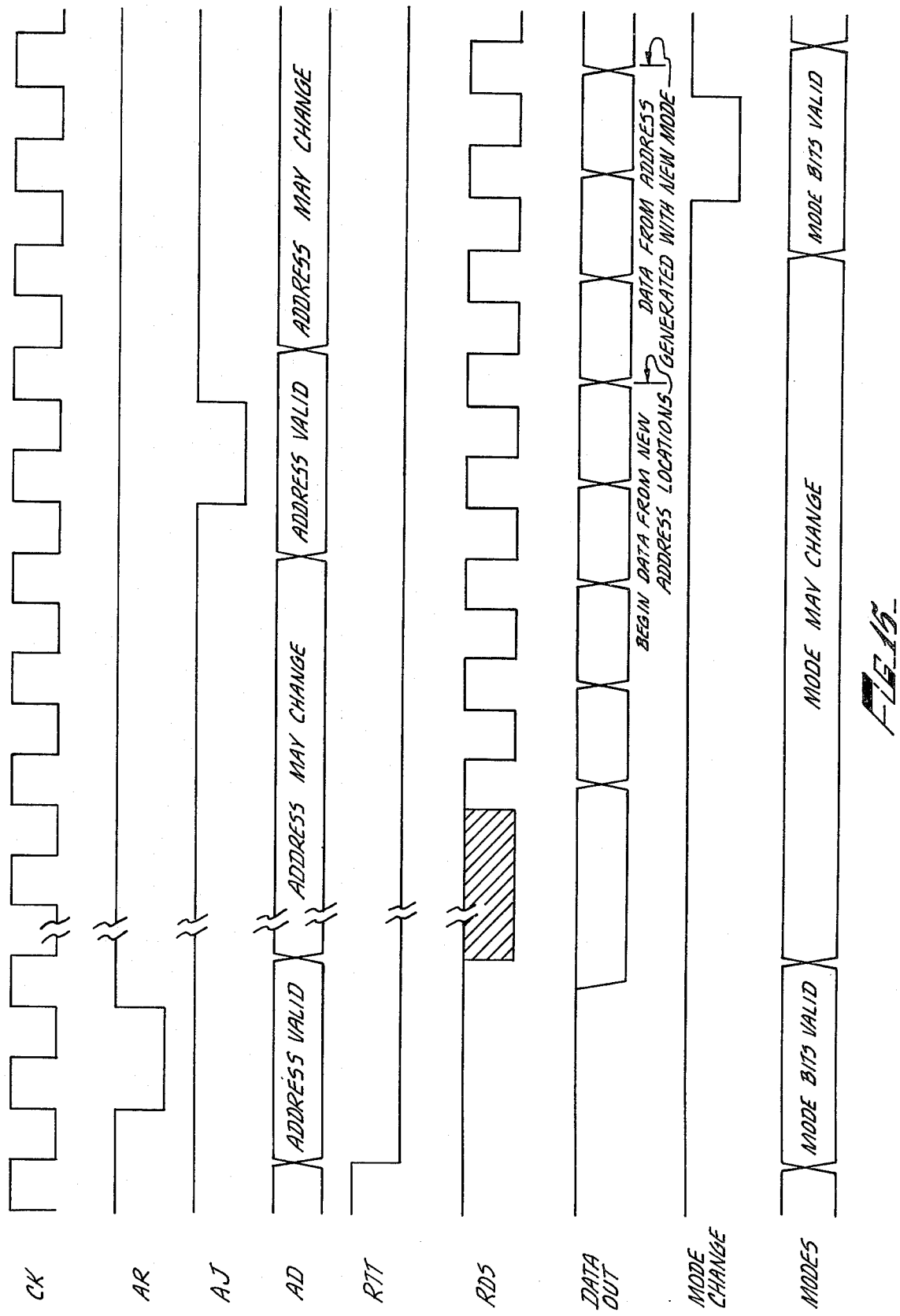

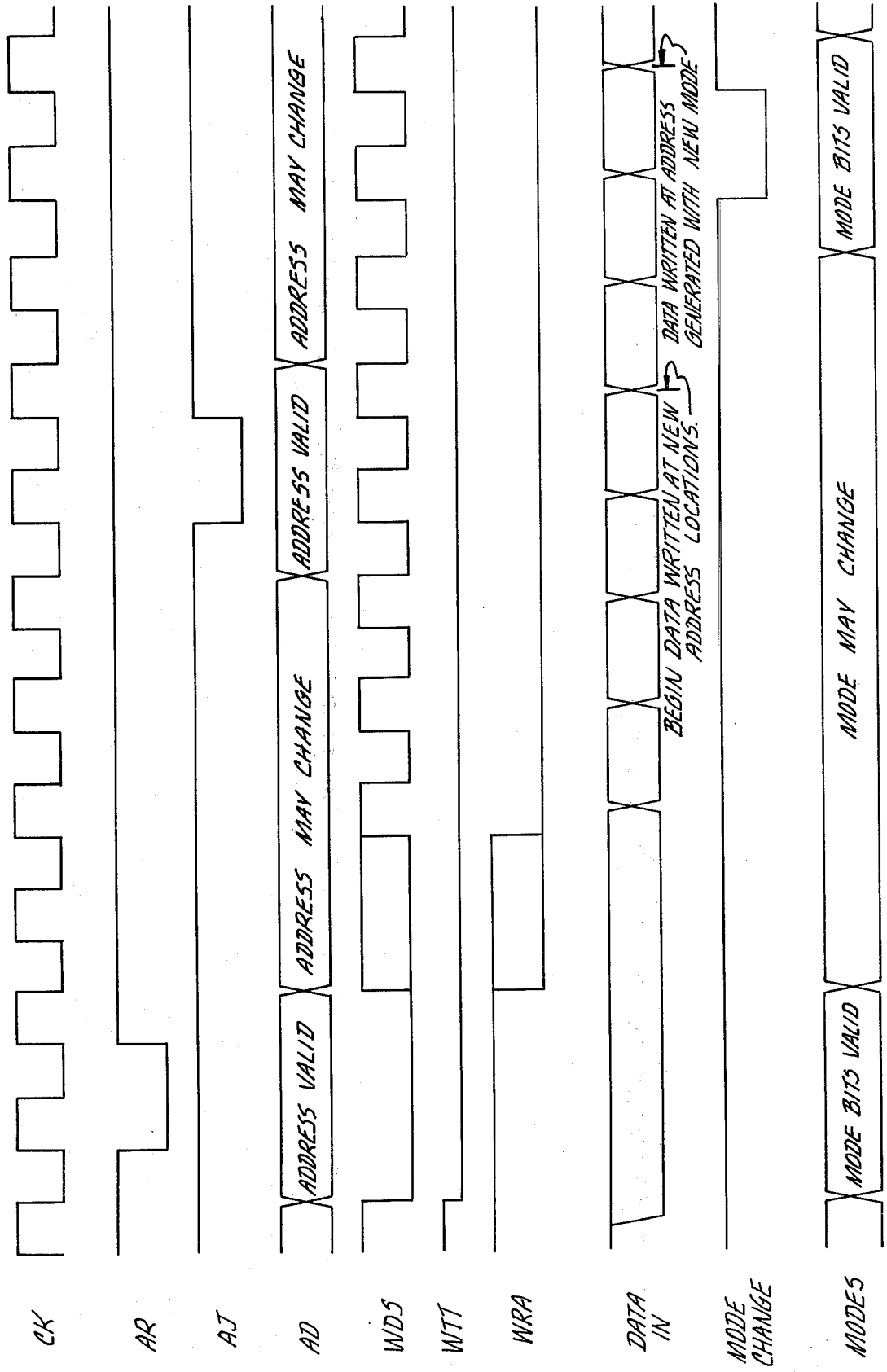

CHARGE COUPLED DEVICE MEMORY WITH ENHANCED ACCESS FEATURES

This is a continuation of application Ser. No. 905,425, filed May 12, 1978, now abandoned.

BACKGROUND OF THE INVENTION

This invention relates generally to computer memory access techniques and, more particularly, to access techniques in a memory composed of circulating shift registers. The invention may find application in charge storage memories where refreshing of stored charge is required such as well-known MOS shift registers, and particularly charged coupled device shift registers.

Charge coupled device shift registers are well-known in the art as shown by U.S. Pat. No. 3,758,794 issued to W. F. Kosonocky on Sept. 11, 1973. In such registers, information is stored as the presence or absence of charge packets of minority carriers in storage cells beneath the electrodes of the register. These packets of minority carriers are initially injected into a register from a source diffusion and are shifted from one electrode to the next by varying the voltage on the register electrodes. Various arrangements for varying the electrode voltage and clocking the registers are known using two, three or four phase voltages.

The application and technology of charge coupled devices have been discussed in number of papers, including W. S. Boyle and G. E. Smith, "Charge-coupled Devices—A New Approach To MIS Device Structures," *IEEE Spectrum*, July 1971; pages 18 through 27 Altman, "The New Concept for Memory and Imaging: Charge Coupling", *Electronics*, June 21, 1971; pages 50 through 59 and in various patents including U.S. Pat. Nos. 3,997,882 and 3,942,163 issued to D. K. Goyal on Dec. 14, 1976 and Mar. 2, 1976 respectively and U.S. Pat. Nos. 4,011,548 and 3,975,717 issued to G. Panigrahi on Mar. 8, 1977 and Aug. 17, 1976 respectively.

These articles and patents describe the physical configuration of CCD shift registers, and the required control and refresh circuitry necessary to operate the CCD registers. Particularly the manner of switching between high speed shift clocks for searching and low speed shift clocks for idle modes is illustrated.

The subject invention particularly pertains to a memory which includes an array of circulating shift registers each of which is accessible for input and/or output at one location only. The shift registers are stacked one on the other so that a matrix of data bits is formed. In the past, it has been typical to access such shift registers in a parallel manner in which successive columns of data bits make up a word. Each column is then successively accessible by clocking it to the parallel-arranged outputs of the plurality of circulating registers. This method of access is quite restrictive. For greater flexibility and utility in performing certain computer operations, it would be highly desirable to be able to access such a matrix in many other modes, for example, by column and diagonal, with the capability to switch between these modes.

SUMMARY OF THE INVENTION

It is therefore an object of the invention to provide an improved memory system.

It is another object of the invention to improve memory systems of the circulating shift register type.

It is still another object of the invention to enable access to a circulating shift register memory in a plurality of modes including vertical (column), horizontal (row) and diagonal.

It is still another object of the invention to provide a circulating shift register memory with the capability to jump addresses while performing a particular mode of access.

These and other objects and advantages of the invention are accomplished by arranging a plurality of circulating shift registers to form a matrix of bits accessible at a common data front and providing means for selecting, upon each shift of said circulating shift registers, the appropriate bit location on the data front, which when accessed will provide one of a plurality of selected modes of access. These modes of access may include access to a diagonal line of data bits, the data bits of a particular circulating register (a row) or a particular column. An access may also include a switch between these modes or a continuation of the same mode from a jumped-to address.

BRIEF DESCRIPTION OF THE DRAWINGS

The particular manner of making and using the preferred embodiment, in the best mode presently known, will now be described in detail in conjunction with the drawings of which:

FIG. 7 illustrates a horizontal access pattern with an access jump.

FIG. 8 illustrates a vertical access pattern with an access jump.

FIG. 9 illustrates a diagonal access pattern with an access jump.

FIG. 12A depicts address counter circuitry according to the preferred embodiment of the invention.

FIG. 12B is a circuit diagram of address counter circuitry facilitating a horizontal access mode.

FIG. 12C is a circuit diagram of address counter circuitry facilitating a vertical access mode.

FIG. 12D is a circuit diagram of address counter circuitry facilitating a diagonal access mode.

FIGS. 13–16 are timing diagrams useful in illustrating the structure and operation of the preferred embodiment.

DETAILED DESCRIPTION OF THE PREFERRED EMBODIMENT

In considering the memory system of the preferred embodiment of the invention in detail, it is first instructive to consider the memory accessing capabilities provided by the preferred embodiment. For this purpose, a number of shift register loops 11 are illustrated in FIG.

1. These loops 11 constitute a circulating memory system having M circulating loops, each loop containing N bits.

Figure 2:
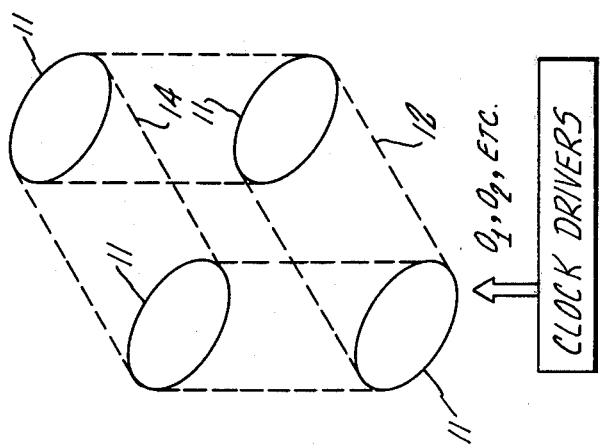
FIG. 2 illustrates a three dimensional grouping of a plurality of shift register segments of FIG. 1.

Each loop O ... M may have parallel loops disposed adjacent thereto to form a three dimensional block, as shown in FIG. 2. In FIG. 2, each group of parallel loops, for example those disposed along lines 12, 14, comprise a data cylinder. Groups of bits such as data words may then be stored across the data cylinder, for example one word lying along line 14.

Each shift register 11 is a separate physical entity that communicates with the outside world at an access port $F_0$ (Front 0). All the data bits that are at the access ports $F_0$ of all the shift registers 11 can be accessed within one data cycle. All the data bits that are one position away from the access ports $F_0$ are denoted by '$F_1$' and so on.

Data stored in these vertical fronts $F_0$, $F_1$ ... are called data fronts $D_0$, $D_1$, ... etc. The data fronts $D_0$, $D_1$ ... are moved around by applying shift clocks to the shift registers 11.

According to the preferred embodiment, the data in the shift registers 11 is accessible in horizontal, vertical and diagonal access modes. An "access jump" capability is also provided. Access jump provides the capability to jump from one location to another across the vertical access front without having to initiate a new request and possible penalty in transfer time. The access techniques just mentioned will now be discussed in more detail with reference to FIG. 3.

Figure 3:
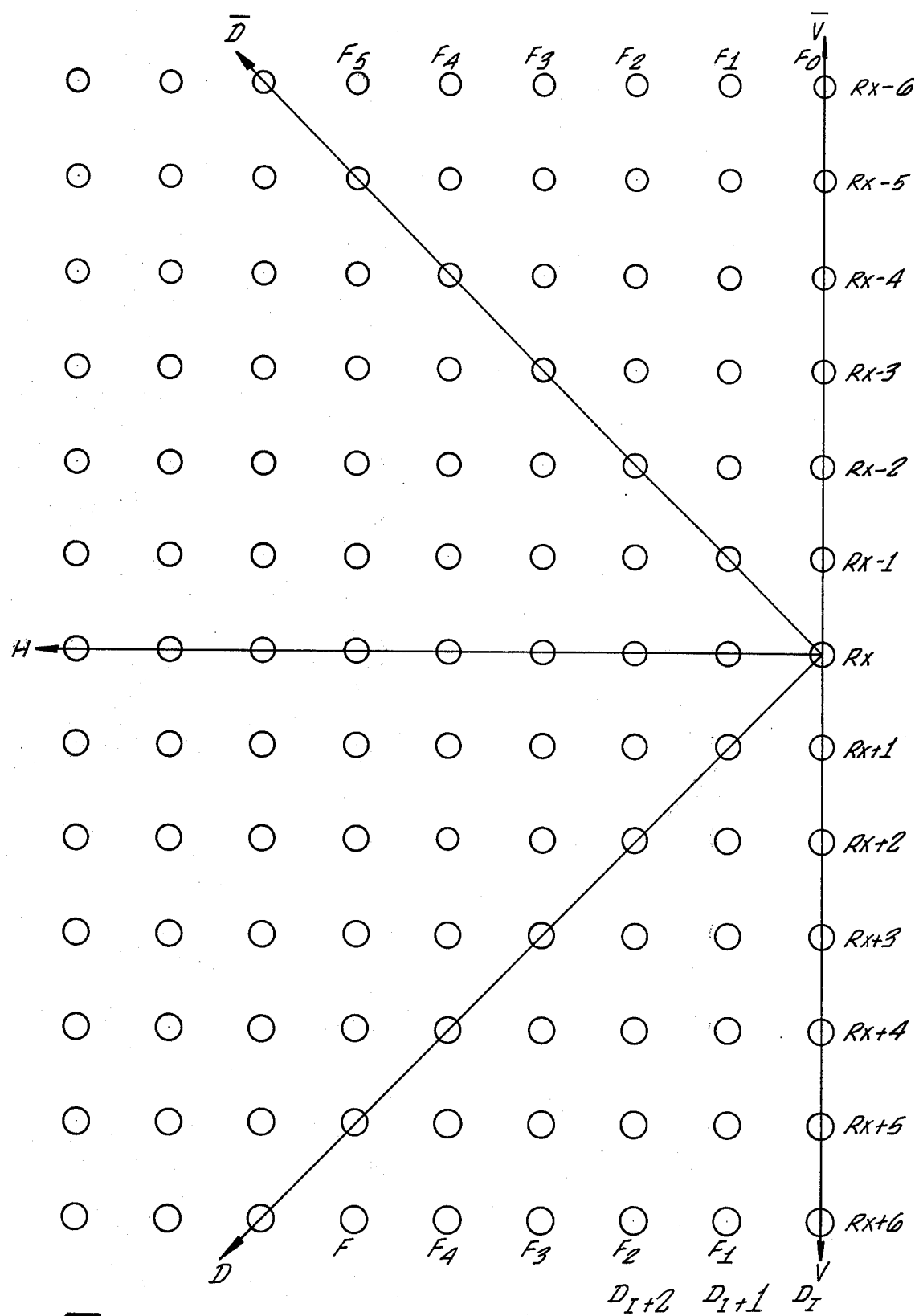
FIG. 3 is a schematic diagram of a bit matrix formed by the register arrangement of FIG. 1.

As shown in FIG. 3, the address mapping of linear access patterns, such as, horizontal, vertical, diagonal can be represented by five vectors H, D, $\overline{D}$, V and $\overline{V}$. Each shift register 11 is denoted $R_{x+i}$, i=0, ±1, ±2 ... to represent its vertical position. Since most of the charge coupled memory devices shift data in one direction and not in both directions, the above five vectors in the left half of the plane can suitably represent all possible address mapping for such devices. In the case of bidirectional devices, the vector representation can be easily extended to include all the access patterns.

The computer processor or other host system which utilizes the memory system of the preferred embodiment specifies an access pattern by supplying the beginning address ($D_{I,X}$) and 3 binary mode bits that represent the five access vectors H, V, D, $\overline{V}$, $\overline{D}$. The three mode bits can also be split into two parts, 2 bits identifying the vectors (H, V, D) and 1 bit identifying the upper or the lower quadrant. In response to the beginning address and mode bits, the memory system of the preferred embodiment performs the indicated addressing sequence.

Figure 1:
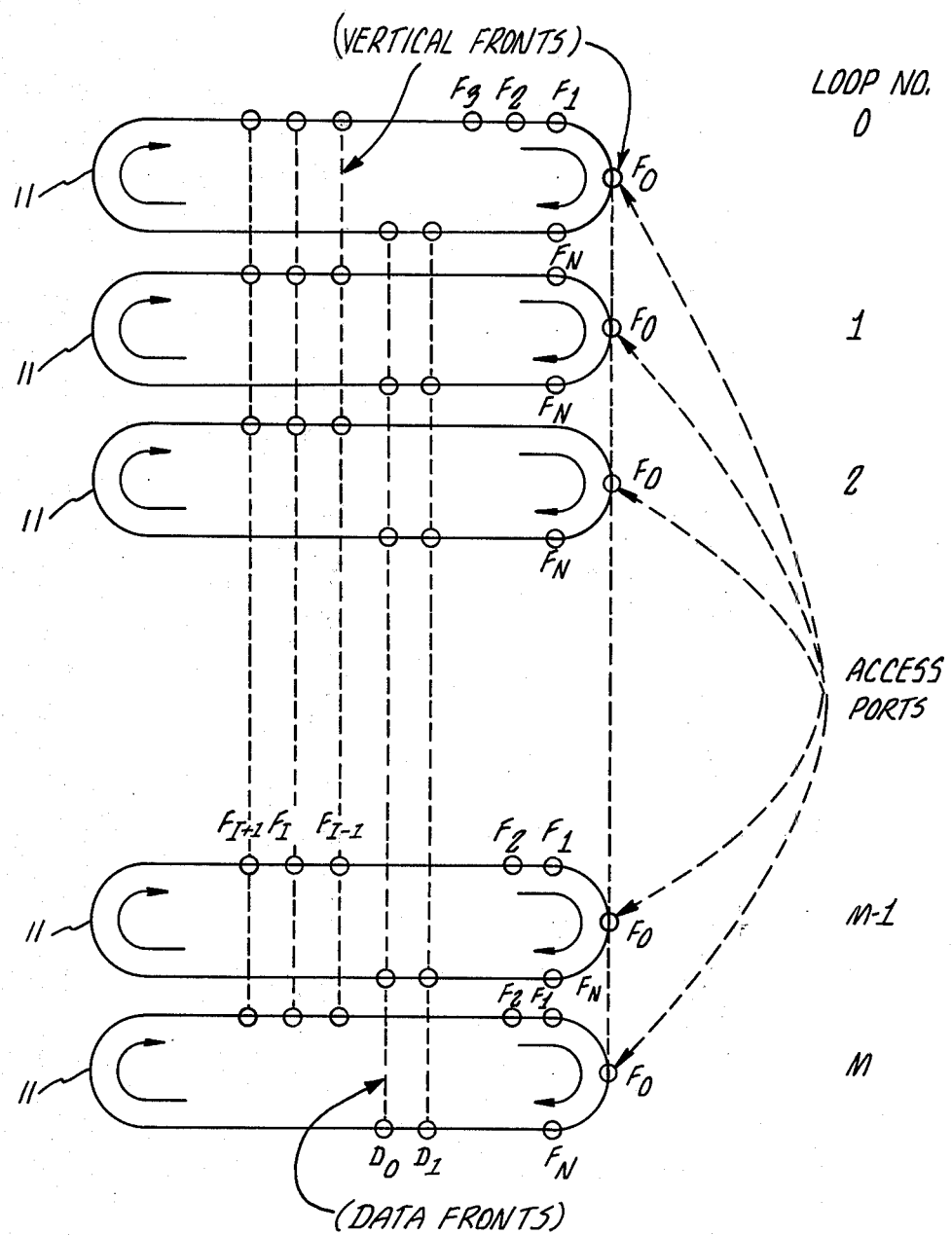
FIG. 1 is a schematic diagram of a segment comprising a plurality of circulating shift registers arranged for input/output at a common data front according to the preferred embodiment.
Figure 6:
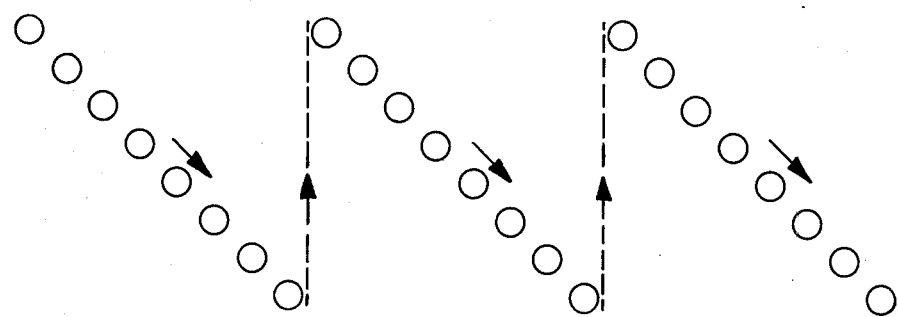
FIG. 6 illustrates a diagonal access pattern.
Figure 4:
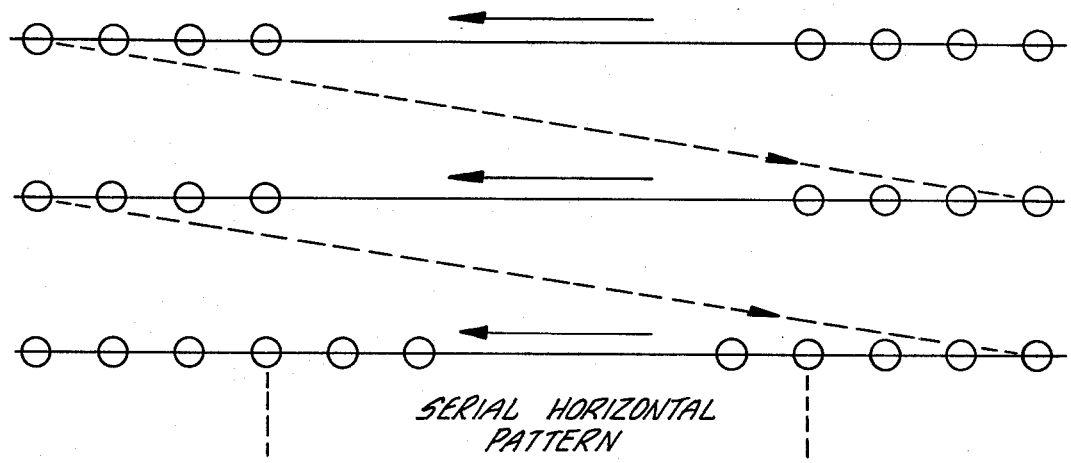
FIG. 4 illustrates a horizontal access pattern.
Figure 5:
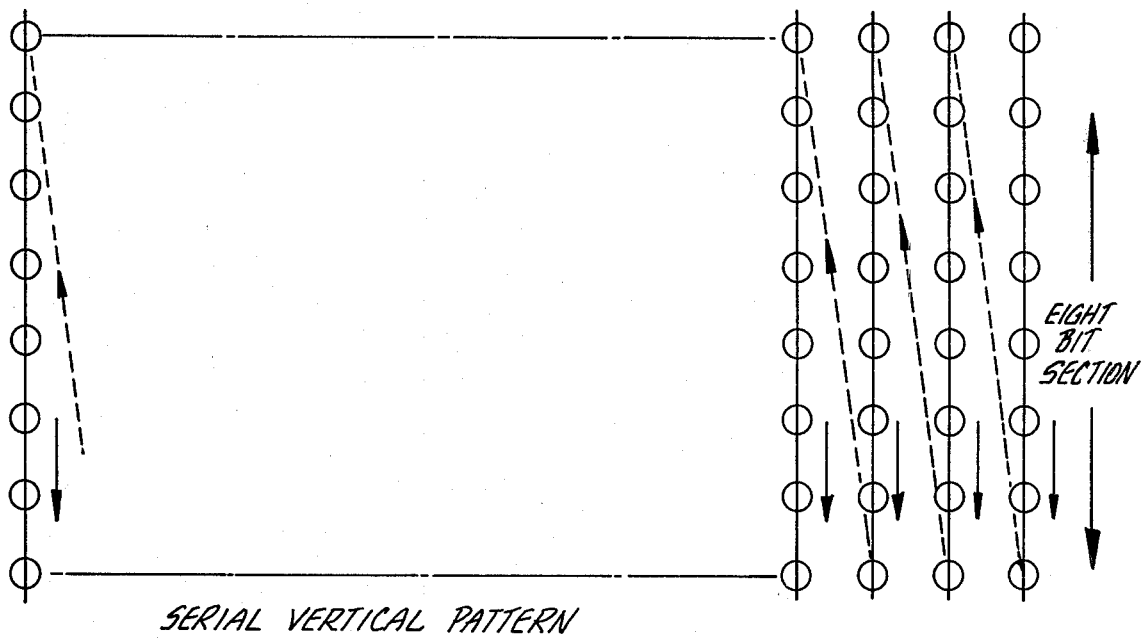
FIG. 5 illustrates a vertical access pattern.

Horizontal, vertical and diagonal addressing sequences are illustrated in FIGS. 4, 5, and 6 respectively. These sequences may be expressed as follows:

Horizontal Mode (FIG. 4). All the remaining bits of register $R_X$, all the bits up to and including $D_{N,X}$, are accessed. Then, the bits from register $R_{X+1}$ are accessed starting at $D_{0,X+1}$ and so on. The address sequence is shown below:

| Horizontal Mode (H) Starting Address $D_{I,X}$ | | | | |
|---|---|---|---|---|
| | $D_{I,X}$ | $D_{I+1,X}$ | .... | $D_{N,X}$ |
| $D_{0,X+1}$ | $D_{1,X+1}$ | $D_{2,X+2}$ | .... | $D_{N,X+1}$ |
| $D_{0,X+2}$ | $D_{1,X+2}$ | $D_{2,X+2}$ | .... | $D_{N,X+2}$ |

Vertical Mode (FIG. 5). Maximum of v bits are accessed each from data front $D_I$, $D_{I+1}$, $D_{I+2}$ ..., etc., successively. The address pattern in sequential vertical mode are shown below:

| Positive Vertical Mode (V+) Starting Address $D_{I,X}$ | | | | |
|---|---|---|---|---|
| $D_{I,X}$ | $D_{I,X+1}$ | $D_{I,X+2}$ | ... | $D_{I,X+v}$ |
| $D_{I+1,X}$ | $D_{I+1,X+1}$ | $D_{I+2,X+2}$ | | $D_{I+1,X+v}$ |
| $D_{I+2,X}$ | . | . | | . |

| Negative Vertical (V−) Mode, Starting Address $D_{I,X}$ | | | | |
|---|---|---|---|---|
| $D_{I,X}$ | $D_{I,X-1}$ | $D_{I,X-2}$ | ... | $D_{I,X-v}$ |
| $D_{I+1,X}$ | $D_{I+1,X-1}$ | $D_{I+1,X-2}$ | | $D_{I+1,X-v}$ |
| $D_{I+2,X}$ | . | . | | |

Because of device refresh limitations, there are limits to the maximum number of vertical accesses (v) before shift.

Diagonal Mode (FIG. 6). The diagonal mode is similar to horizontal mode in the sense that one bit is accessed from each front after a shift cycle. However, the register address is increased after every shift in D+ mode and decreased after every shift in D− mode. Exemplary address patterns in the case of sequential diagonal modes are shown below:

| Positive Diagonal (D+) Mode, Starting Address $D_{I,X}$ | | | | |
|---|---|---|---|---|
| $D_{I,X}$ | $D_{I+1,X+1}$ | $D_{I+2,X+2}$ | ... | $D_{N,X+N-I}$ |
| $D_{0,X+N-I+1}$ | $D_{1,X+N-I+2}$ | .... | | |

| Negative Diagonal (D-) Mode, Starting Address $D_{I,X}$ | | | | |
|---|---|---|---|---|
| $D_{I,X}$ | $D_{I+1,X-1}$ | $D_{I+2,X-2}$ | ... | $D_{N,X-N+I}$ |
| $D_{0,X-N+I-1}$ | $D_{1,X-N+I-2}$ | .... | | |

In the preferred embodiment, the mode can be changed during a transfer without initiating a new request. If there is no change in mode pattern during access, the access is continued with the starting mode. FIGS. 7-9 show examples of access jumps during access. In FIG. 7, the vertical coordinate is jumped to enter next row. In FIG. 8, the horizontal address is jumped to enter another column. In FIG. 9 the vertical coordinate is again jumped to enter another diagonal. Other access variations include changing between horizontal, vertical and diagonal modes during access and/or including access jumps between such mode changes.

Figure 10:
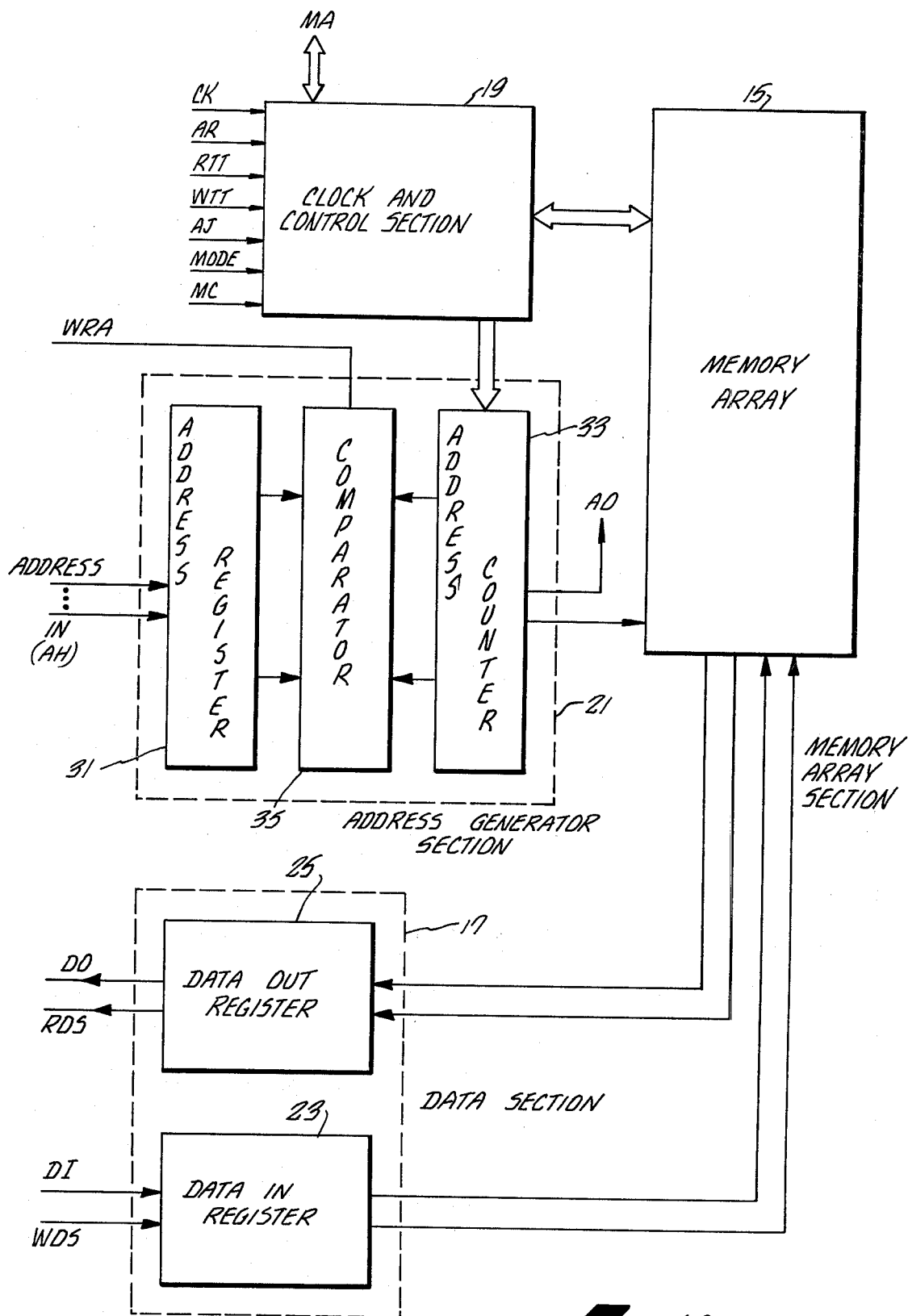
FIG. 10 is a schematic block diagram of a memory system according to the preferred embodiment of the invention.

A block schematic of a system according to the preferred embodiment for implementing the just detailed access features utilizing circulating shift registers is illustrated in FIG. 10. This system includes the following sections: a memory array section 15, a data section 17, a clock and control section 19 and an address generation section 21.

The memory array section 15 may include one of the shift register memory arrays as illustrated in FIG. 2, or it may include several sections each comprising a shift register array as illustrated in FIG. 2. It also includes the associated drive and decoding circuitry, as well-known in the art.

The data section 17 includes Input and Output Registers 23, 25. If several memory systems were to be multiplexed, the data section 17 would also include the multiplexing logic circuitry.

The clock and control section 19 includes the clock generating circuitry necessary to supply clock signals (shift clock phases and control clock signals like Chip Enable (CE), Write Enable (WE), etc.) to the memory array 15 and to an address counter 33 in an address generator section 21. The clock and control section 19 also supplies access control signals to the address generation section 21, as will be elaborated on below.

The address generator section 21 includes an address register 31 that latches in the input address, the address counter 33 that is shifted by the memory shift pulses and a comparator 35 that compares the requested data front address in the address register 31 with the output data front address from the address counter 33. The address counter 33 generates the internal addresses for accessing the required data in the memory array section 15. When the requested data front address matches with the present output data front, the access operation is initiated. Depending upon the mode of access (Horizontal/Vertical/Diagonal), different counter operations are set up in addition to the proper selection of memory shift clocks, as discussed in more detail below.

The incoming control signals supplied by the host system to the memory system of FIG. 10 and function of each of these signals is explained below:

Clock (CK): drives the system clock generator.

Access Request (AR): The host system issues this strobe to indicate to the system that a new address is on the address lines.

Read Transfer Time (RTT): Goes true when handshake is started and returns false whan transfer is complete. It indicates to the memory system that a read operation is in progress.

Write Transfer Time (WTT): When true indicates a write operation and when false indicates a read operation.

Write Data Strobe (WDS): Sent to the memory system for the purpose of strobing the input data lines during a write transfer.

Access Jump (AJ): The host system issues this strobe to indicate to the memory system that an access jump is requested and that a new address is on the address lines.

Address In (AH): Bits of this address defines starting address of a transfer.

Data In (DI): Data bits from host system to the memory system.

Mode (M): Indicates which one of the modes H, V+, V−, D+, or D− is requested.

Mode Change (MC): Signals to the memory system that a mode change is requested.

The output signals produced by the memory system and the function of each of these signals is explained below:

Memory Available (MA): Indicates to the host that the memory system is operational.

Write Request Acknowledge (WRA): memory system issues this signal to indicate to the host system that the search operation is complete and writing will start. This signal holds true as long as host system supplies data strobes.

Read Data Strobe (RDS): the memory system issues this strobe to indicate to the host system that valid data is on the data lines.

Data Out (DO): Data bits of data from the memory system to the host system.

Address Out (AO): Output of the status counters that indicate the address of the data front that is at the access port.

The various circuit subsections of the clock and control section 19 will now be described in more detail to particularly illustrate the apparatus for implementing the various access modes.

Figure 11:
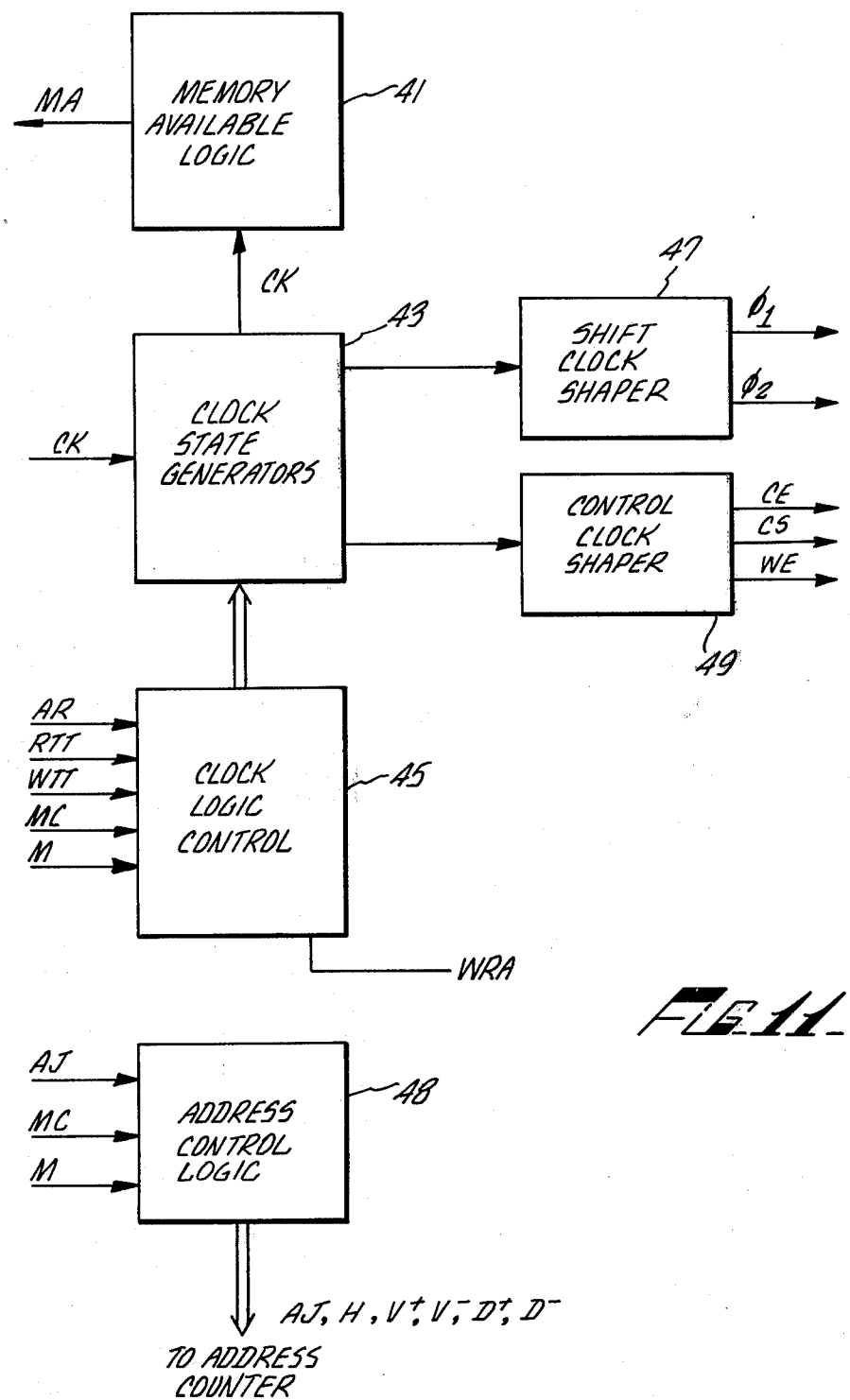
FIG. 11 is a schematic diagram of the clock and control section of FIG. 10.

The clock and control section 19 is more specifically detailed in FIG. 11. It includes memory available logic 41, clock state generators 43, clock control logic 45, address control logic 48 and clock shapers 47, 49.

The memory available logic generates a memory available signal MA that is 'on' if the supply voltages are present and shift clock pulses occur within a time interval, at least, satisfying the refresh time requirements.

The clock state generator 43 generates the clock phases required to generate the shift clock signal phases ($\phi_1, \phi_2 \ldots$), for high frequency shift ($f_H$) and low frequency shift ($f_L$) and control signals chip enable CE, chip select CS and write enable WE. The clock shaper circuits 47, 49 appropriately shape the generated clocks and control signals to produce signals which meet the timing requirements of the particular storage array under consideration. The generation of necessary clock and control signals for shift register arrays such as CCD's are well-known in the art and will not be described in further detail.

The clock control logic controls application of the high and low frequency shift rates to the memory array. When the access request signal AR is received, indicating a new address is on the line, the memory system is switched to a search state from idle state. In the search state, the memory system shifts at a higher frequency $f_H$, as opposed to the lower idle frequency $f_L$ until the new address is located in the memory system. After the 'Comparison' signal WRA is received, the memory clock is switched to $f_H$ or $f_L$ depending upon the input mode M. This switch is simply accomplished by decoding the mode M and gating either a high or low frequency clock from the generator 43 to the shaper 47. In the horizontal and diagonal access modes, the shift clock is at the high frequency $f_H$ in the access state, whereas the shift clock is switched to a low frequency $f_L$ in the vertical access mode. When the read or write operations are terminated, the read transfer timing signal RTT or the write transfer timing signal WTT, supplied by the host system, changes to a high state. This change, in turn, switches the memory to the idle state and the low clock frequency $f_L$. In the case of a mode change operation, the input mode is received, and the shift clock is switched to $f_L$ or $f_H$ depending upon whether the new mode is vertical or horizontal/diagonal.

The address control section 48 sends appropriate control signals AJ, H, V+, V−, D+, D− to the address generator section 21. Access jumps and mode changes necessitate generating new shift register loop addresses. In the case of an access jump AJ, the input jump address is received and loaded into the address counter 33 through the pre-set inputs of appropriate sub-counters in the address counter 33. For a mode change, the address counter 33 is reconfigured in accordance with mode control signal H, V+, V−, D+ or D− supplied to generate the appropriate sequential addresses. The construction and operation of the address counter 33 will now be discussed in more detail.

FIG. 12A illustrates address counter configurations for different address modes in an N×N (e.g. 256 row by 256 column array). As shown in FIG. 12A, there are four counter sections 51, 53, 55, 57 in the address counter 33. The data front address counter 51 generates the address of the data front at the access port. The vertical address counter 53 generates the vertical address sequence. The subsection address counter 55, together with the vertical address counter, generates a total of N vertical sequence. The section address counter 57 generates the address for selecting successive memory sections in the case of a multiple section memory.

Considering the example of a 256×256 array, the data front address counter counts 256 columns and is $Log_2 (256) = 8$ bits long. The vertical address counter is arranged to count eight rows and is three bits long $[Log_2(8) = 3]$. The subsection address counter is then set to count the number of vertical sections necessary to account for the N vertical dimension and is $Log_2 (256) - Log_2(8) = 5$ bits long.

The address counter configuration in the horizontal mode is shown in FIG. 12B. The data frequency is the same as the horizontal shift high frequency ($f_H$). The data front, vertical address, subsection address, and section address counters are connected in tandem. Thus, each time the N bits in a horizontal row have been read out or written in, the data front counter 51 increments the vertical counter 53 to cause the next successive row in the array to be enabled. The subsection address counter functions as an extension of the vertical address counter 53 so all rows will be counted before the section address counter is incremented. When the section address counter is incremented, a new N×N section is addressed.

FIG. 12C shows the address counter configuration for the vertical mode. Here, the vertical address counter 53 drives the data front address counter 51. The subsection counter 55 is driven by the data front counter 51 and drives the section counter 57. Thus, in the example under consideration, eight bits from a vertical row will be successively addressed. Then the data front counter will be incremented once and a new eight bits in the same subsection will be moved forward for access. Once an entire front eight bits wide and N bits long has been accessed, the subsection address counter 55 is incremented, indicating that the next successive 8×N bit subsection in the N×N memory array is to be addressed. After each subsection has been addressed in the vertical mode, the section address counter 57 is incremented. The vertical data frequency ($f_{data}$) can be higher than $f_H$ as the decoding circuits to select the access port can be faster than the circuits that clock a large amount of parallel capacitance in the horizontal mode.

FIG. 12D shows the address counter configuration for the diagonal mode. The vertical address counter 53 and subsection address counter 55 are connected in tandem but in parallel with the data front address counter 51. The section address counter 57 is clocked by the output of the data front address counter 51. Thus, as the array is clocked one position in the horizontal direction, the vertical address is also incremented by one so that the next bit accessed is one over and one down from the previous access, and hence on the diagonal of the array. The subsection counter 55 is again an extension of the vertical counter 53 which allows counting of N rows (N bits in the vertical direction).

In an actual embodiment, separate counter set-ups corresponding to FIGS. 12B, 12C and 12D could be utilized and activated depending upon the H, V or D mode signal. Alternatively, gates appropriately responsive to these signals H, V or D can be utilized to appropriately configure the counter units of FIG. 12A into those configurations illustrated in FIGS. 12B, 12C and 12D.

As alluded to earlier, access jumps are accomplished by presetting appropriate counters. For example, the access jump of FIG. 7 may be accomplished by presetting the vertical counter 53 (FIG. 12B) to the new row address count. It will be apparent that the counter configurations of the preferred embodiment are illustrative only and other more elaborate horizontal, diagonal and vertical accessing schemes may be implemented.

The sequencing of operations in the preferred embodiment of the invention will now be discussed in more detail with reference to FIGS. 13-16.

FIG. 13 illustrates a Read Normal operation, which proceeds as follows. The access request AR is sent to the memory system. Read transfer time RTT drops, indicating the beginning of a read operation. The starting address AD and Mode (M) are set up. The read data strobes RDS appear along with Data Out after an initial latency period. The latency time corresponds to the time that it takes for the requested starting data front locations to be shifted to the access ports and may be up to N cycles. Access jump signals AJ and Mode change signals MC are not present in a Read Normal sequence of operation.

FIG. 14 illustrates a Write Normal operation. The access request signal AR is sent to the memory system. The Write Data Strobe WDS, starting address AD and Mode M are set up. The Write Request Acknowledgement WRA occurs after an initial latency period. The latency time corresponds to the time that it takes for the requested starting data front locations to be at the access ports and may again be 0 to N cycles. Access jump AJ and mode change signals MC are again not present in a write normal sequence of operations.

FIG. 15 illustrates a read with an access jump and mode change. In the case of an access jump, the host system first sets up the beginning address of the new location (or the amount of offset from the present address). Second, this new address information is latched in to the address register 31 with the access jump signal AJ. In case of an access jump read operation, the access jump signal is initiated before the access jump itself. In the next cycle, data from the new location is read. The read operation continues in the conventional read mode until terminated by the read transfer time signal RTT. In the case of a mode change, the mode change signal MC along with the new mode bits M are sent to the memory system. This information is latched in the mode and access control section to change the address generation and clock generation mechanism. Data is read out from the address location corresponding to the new mode.

FIG. 16 illustrates a write with an access jump and mode change. In the case of an access jump during a write operation, the access jump signal AJ along with the new starting address are sent to the memory system. Data is written into the location corresponding to the new address in the next cycle. In case of a mode change, the mode change signal MC along with the new mode bits are sent to the memory system. Data is written into the address locations corresponding to the new mode. In either FIG. 16 or FIG. 15, there is no restriction on the number of access jumps and mode changes. An access jump and mode change can also occur during the same cycle.

The memory system may also perform page jump as a special case of Access Jump. The Memory may have a fixed memory page map whereby the storage will be divided into page sizes. Data is implicitly accessed from successive related locations except in the case of a page jump request when data is accessed from the beginning of a new page. Page jump is made only from the end of a page to the beginning of a new page. The host system has the responsibility to anticipate the end of the page and issue the proper page jump request.

From the above discussion, it should be apparent that numerous modifications and adaptations may be made in the preferred embodiment without departing from the scope and spirit of the invention. It is therefore to be understood that, within the scope of the appended claims, the invention may be practiced other than as specifically described herein.

What is claimed is:

1. A circulating shift register memory system comprising:

a plurality of circulating shift registers arranged as a matrix having a plurality of rows and a plurality of columns for shifting data in the respective rows from column to column in a circular fashion;

a single access port at each row at one column of said matrix for reading data therefrom and writing data thereto;

addressing means for receiving first control signals representing a selectable starting row-column address of said matrix, and for receiving second control signals representing selectable sequences for addressing said matrix beginning with said starting row-column address;

counter and comparator means for determining when data at the column of said starting address is shifted to said access ports; and clock and control means for thereafter selectively enabling said output ports as said columns of data are shifted by them to read from/write to said matrix in accordance with the sequence specified by said second control signals;

said clock and control means for selectively enabling including a first control means for sequentially enabling said output ports in a horizontal sequence, a second control means for sequentially enabling said output ports in a vertical sequence, and a third control means for sequentially enabling said output ports in a diagonal sequence.

2. The memory system of claim 1 and further including fourth control means for changing from one selectable sequence to another selectable sequence during a read/write operation.

3. The memory system of claim 2 and further including fifth control means for jumping to a new address location in said matrix while maintaining the address selection sequence constant.

* * * * *